US010072330B2

(12) United States Patent
Kim

(10) Patent No.: US 10,072,330 B2
(45) Date of Patent: Sep. 11, 2018

(54) SHIELD MASK MOUNTING FITTING FOR A SPUTTERING APPARATUS

(71) Applicant: SAMSUNG DISPLAY CO., LTD., Yongin-si, Gyeonggi-Do (KR)

(72) Inventor: Jong Yun Kim, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 294 days.

(21) Appl. No.: 14/843,554

(22) Filed: Sep. 2, 2015

(65) Prior Publication Data

US 2016/0214136 A1     Jul. 28, 2016

(30) Foreign Application Priority Data

Jan. 22, 2015   (KR) ......................... 10-2015-0010847

(51) Int. Cl.
*B05C 21/00*      (2006.01)
*C23C 14/56*      (2006.01)
*H01J 37/34*      (2006.01)
*C23C 14/34*      (2006.01)

(52) U.S. Cl.
CPC ............ *C23C 14/564* (2013.01); *C23C 14/34* (2013.01); *H01J 37/3447* (2013.01); *H01J 37/3488* (2013.01)

(58) Field of Classification Search
None
See application file for complete search history.

(56) References Cited

U.S. PATENT DOCUMENTS

| 4,517,070 A * | 5/1985 | Kisner ................. H01J 37/3408 204/192.12 |
| 4,747,737 A * | 5/1988 | Roffelsen ................ F16B 19/02 248/316.3 |
| 2001/0019016 A1* | 9/2001 | Subramani ............ H01J 37/321 204/192.1 |
| 2011/0138940 A1* | 6/2011 | Krueger ............... B60N 2/2252 74/60 |
| 2013/0202990 A1* | 8/2013 | Jindal ..................... C23C 14/34 430/5 |

FOREIGN PATENT DOCUMENTS

| KR | 10-2006-0128550 A | 12/2006 |
| KR | 10-2011-0062711 A | 6/2011 |
| KR | 10-2011-0063058 A | 6/2011 |
| KR | 10-2013-0063680 A | 6/2013 |

* cited by examiner

*Primary Examiner* — Charles Capozzi
(74) *Attorney, Agent, or Firm* — Lee & Morse, P.C.

(57) ABSTRACT

A shield mask mounting fitting includes a shied mask to be mounted on a chamber wall of a sputtering apparatus, the shield mask including a fixing hole, a fixing bolt connecting the shield mask to the chamber wall through the fixing hole, a cap hook surrounding a top of the fixing bolt, a bushing extending between a surface of the shield mask and the cap hook, and a shield cap engaged with the cap hook and covering the top of the fixing bolt, the shield cap extending beyond the cap hook to omnidirectionally cover a periphery of the fixing hole, wherein one of the cap hook and the shield cap has an asymmetric structure with respect to an axis extending through a center of the fixing bolt.

9 Claims, 7 Drawing Sheets

SHIELD MASK MOUNTING FITTING FOR A SPUTTERING APPARATUS

CROSS-REFERENCE TO RELATED APPLICATION

Korean Patent Application No. 10-2015-0010847, filed on Jan. 22, 2015, in the Korean Intellectual Property Office, and entitled: "Shield Mask Mounting Fitting For Thin Film Deposition," is incorporated by reference herein in its entirety.

BACKGROUND

1. Field

The described technology relates generally to a shield mask mounting fitting for a sputtering apparatus. More particularly, the described technology relates to a shield mask mounting fitting for a sputtering apparatus that prevents peeling of a thin film deposited around a fixing bolt, and therefore, prevents shortening of a preventive maintenance (PM) cycle.

2. Description of the Related Art

A sputtering apparatus refers to an apparatus that deposits a target material on a predetermined substrate by accelerating ions through plasma to cause the ions to collide with the target material. A sputtering process using such a sputtering apparatus forms a thin film while maintaining the predetermined substrate at a low temperature of about 400° C., e.g., as compared to a chemical vapor deposition apparatus that performs deposition at a high temperature. The sputtering apparatus is capable of forming a deposition film with a relatively simple structure in a short time, and therefore, has been widely used, e.g., in a semiconductor device and in a liquid crystal display.

In a conventional sputtering apparatus, a target portion and a substrate portion are connected to a negative electrode and a positive electrode of a power supply, respectively. DC power is supplied to the power supply, while generating a high frequency, so predetermined electrons are generated from the target portion due to an electric field and are accelerated toward the positive electrode.

At this time, the accelerated electrons collide with an inert gas, thereby ionizing the inert gas. Positive ions of the inert gas collide with the target portion, which is connected to the negative electrode, due to the action of electric field, thereby causing sputtering, i.e., causing particles from the target portion to be released from the surface of the target portion. At the same time, electrons emitted from the target portion and accelerated toward the positive electrode collide with neutral atoms and are excited. In this case, plasma is generated. Such plasma is maintained when external potential is maintained and electrons are continuously generated.

SUMMARY

The described technology provides a shield mask mounting fitting for thin film deposition that prevents a preventive maintenance (PM) cycle from being shortened due to peeling of a film deposited around a fixing bolt.

The described technology also provides a shield mask mounting fitting for thin film deposition capable of preventing internal deposition by stably shielding a periphery of a fixing hole of a shield mask with a simple structure.

An exemplary embodiment provides a shield mask mounting fitting, including a shied mask to be mounted on a chamber wall of a sputtering apparatus, the shield mask including a fixing hole, a fixing bolt connecting the shield mask to the chamber wall through the fixing hole, a cap hook surrounding a top of the fixing bolt, a bushing extending between a surface of the shield mask and the cap hook, and a shield cap engaged with the cap hook and covering the top of the fixing bolt, the shield cap extending beyond the cap hook to omnidirectionally cover a periphery of the fixing hole, wherein one of the cap hook and the shield cap has an asymmetric structure with respect to an axis extending through a center of the fixing bolt.

The cap hook may include a connection groove engaged with a connection protrusion of the shield cap, a center of the shield cap being offset with respect to a center of the connection protrusion in top view.

The cap hook may include an insertion hole, the fixing bolt being inserted through the insertion hole, and a center of the cap hook being offset with respect to a center of the insertion hole in top view.

Surfaces of the shield mask and the shield cap facing away from the chamber wall may be rough surfaces.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
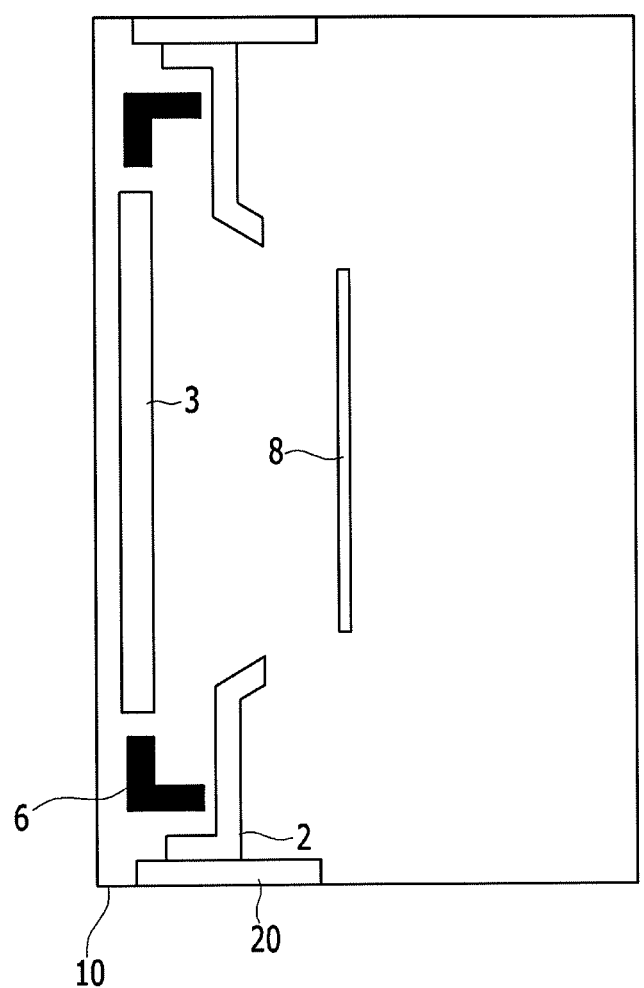
FIG. 1 illustrates a schematic view of an interior of a chamber of a sputtering apparatus according to a first exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, a technical configuration of a shield mask mounting fitting for thin film deposition according to an exemplary embodiment will be described in detail with reference to the accompanying drawings.

A sputtering apparatus according to embodiments may include a substrate portion, a target portion, and a mask portion inside a chamber. In detail, the mask portion may include a mask, a floating mask, and an insulator. The mask is made of a conductive material, e.g., aluminum (Al), in a rectangular edge shape, and functions as a positive electrode upon plasma discharge. The floating mask is made of a conductive material, e.g., aluminum (Al), to be insulated from the mask inside edges of the mask. The insulator is made of an insulating material and electrically insulates the mask from the floating mask. The floating mask limits a region on which particles of a target are deposited and determines a sputtering deposition region on a substrate.

The substrate portion may include the substrate, on which a deposition material is deposited by a sputtering process, and a susceptor, which supports the substrate. The substrate may be positioned between the susceptor and the mask portion.

The target portion may include a magnet, a rear plate, the target, and a ground shield. The magnet applies magnetic field in order to prevent electrons generated from plasma from escaping into a portion other than the sputtering deposition region on the substrate. The rear plate is between the magnet and the target, and fixes the target, which is a deposition material to be formed on the substrate by sputtering, to face the substrate. One or more ground shields are formed between portions of the target. The ground shield may have an "L" shape at edge portions of the target. Such a ground shield is grounded and functions as a positive electrode upon discharge.

Referring to FIG. 1, in order to avoid or substantially minimize deposition of plasma and target material on a region other than the sputtering deposition region of a substrate 8, the sputtering apparatus according to embodiments includes a shield mask 20 that prevents or substantially minimizes omnidirectional sputtering of atoms from a target material 3. For example, the shield mask 20 prevents leakage of atoms through a gap between a ground shield 6 and a mask 2, thereby preventing deposition of atoms on a wall of a chamber 10. As such, impurities, i.e., atoms or particles deposited in regions other than the substrate 8, generated during the sputtering process are prevented from causing arc discharge. Therefore, discharge stability is increased.

Figure 2:
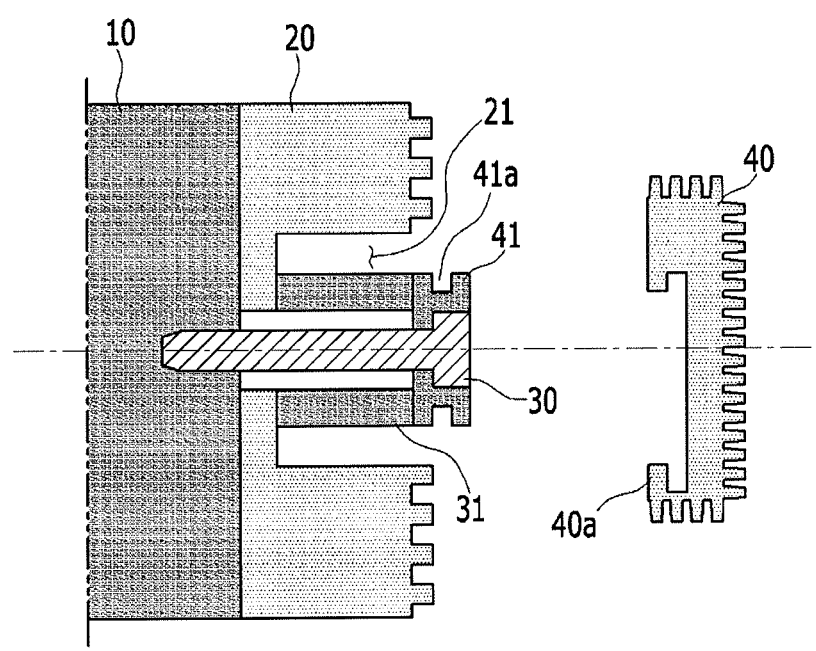
FIG. 2 illustrates an enlarged exploded sectional view of a shield mask mounting fitting for thin film deposition according to a first exemplary embodiment.
Figure 3:
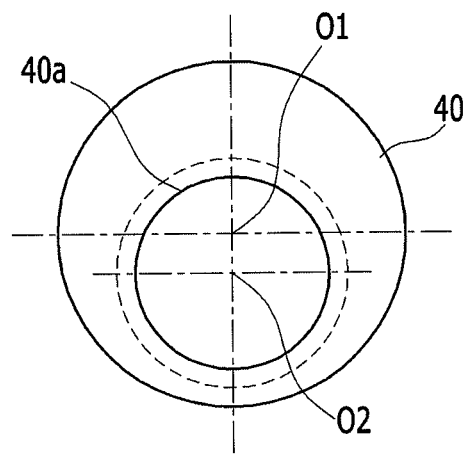
FIG. 3 illustrates a top plan view of a shield cap of a shield mask mounting fitting for thin film deposition according to the first exemplary embodiment.
Figure 4:
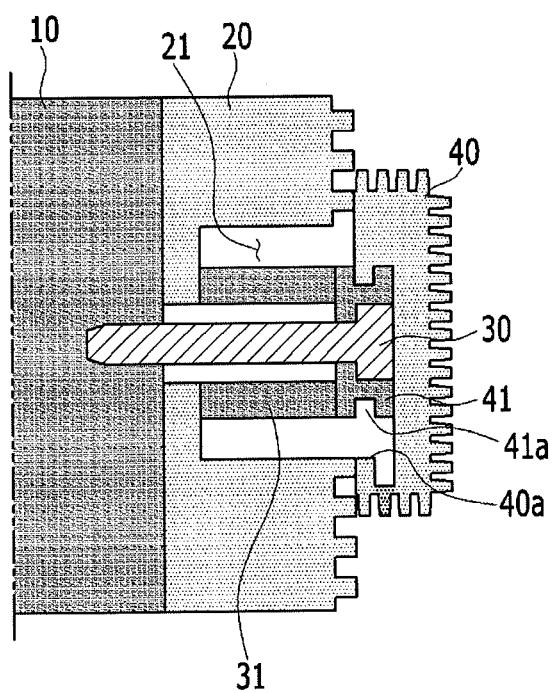
FIG. 4 illustrates an assembled cross-sectional view of the shield mask mounting fitting in FIG. 2.

In detail, referring to FIGS. 2 to 4, a shield mask mounting fitting includes a shield mask 20 to be mounted on a wall of a chamber 10 of a sputtering apparatus. The shield mask 20 may include a fixing hole 21, a fixing bolt 30 connecting the shield mask 20 to wall of the chamber 10 through the fixing hole 21, a cap hook 41 surrounding a top of the fixing bolt 30, a bushing 31 extending between a surface of the shield mask 20 and the cap hook 41, and a shield cap 40 engaged with the cap hook 41 and covering the top of the fixing bolt 30. The shield mask mounting fitting for thin film deposition according to an exemplary embodiment is provided to fix and mount the shield mask 20 to the wall of the chamber 10, e.g., an interior surface of the chamber 10 other than the substrate 8.

The shield mask 20 is provided to prevent a deposition particle escaping from the target 3 from being attached to the wall of the chamber 10. The shield mask 20 is fixed to the wall of the chamber 10 by using the fixing bolt 30. For example, as illustrated in FIG. 2, the fixing bolt 30 is inserted through the fixing hole 21 of the shield mask 20 into a portion of the chamber wall 10.

In this case, it is not easy to perform surface treatment for deposition on a head of the fixing bolt 30. Therefore, the shield cap 40 covers the head of the fixing bolt 30, thereby removing a need to perform surface treatment on the head portion of the fixing bolt 30. Simultaneously, the shield cap 40 extends beyond the head of the fixing bolt 30 to block the periphery of the fixing hole 21 of the shield mask 20 (FIG. 4) to prevent deposition, e.g., of impurity, on the wall of the chamber 10 through the periphery of the fixing hole 21.

The shield mask 20 and the shield cap 40 are processed to have rough surfaces and wide surface areas, such that a film to be deposited thereon is well attached to surfaces thereof. For example, as illustrated in FIG. 2, a surface of the shield mask 20 facing the shield cap 40 has a predetermined roughness (illustrated by teeth in FIG. 2). For example, the surfaces of the shield mask 20 and the shield cap 40 may be processed by surface embossing and is then processed by Al thermal spray.

The bushing 31 may be a type of assistant means that allows engagement between the shield cap 40 and the cap hook 41 to be made stably and easily by adjusting a height of the cap hook 41. For example, the bushing 31 may be a member extending, e.g., connecting, between the shield mask 20 and the cap hook 41. The bushing 31 is formed at a predetermined height according to a depth of the fixing hole 21 of the shield mask 20 or a position at which a connection groove 41a is formed. For example, as shown in FIG. 4, the shield cap 40 may be formed at a height suitable to come into contact with the surface of the shield mask 20 in a state of being engaged with the cap hook 41, and tightly, e.g., and completely, cover the entrance of the fixing hole 21.

The shield mask mounting fitting for thin film deposition according to embodiments may be implemented such that an asymmetric structure is applied to one of the cap hook 41 and the shield cap 40. The asymmetric structure refers to a structure in which predetermined means for engagement formed in one of the shield cap 40 and the cap hook 41 is disposed to be offset from a center axis of the fixing bolt 30. For example, as illustrated in FIG. 2, the shield cap 40 may be asymmetric with respect to an axis along the fixing bolt 30 in the fixing hole 21 of the shield mask 20.

In detail, upon engagement, the asymmetric structure effectively prevents pollution, i.e., deposition of particles escaping from the target 3, in such a manner that a connection margin of the shield cap 40, which tightly covers the periphery of the fixing hole 21 of the shield mask 20, shields the fixing hole 21 omnidirectionally.

In further detail, as shown in FIGS. 2 to 4, the shield cap 40 may be formed such that a center of a connection protrusion 40a is disposed at a position deviating from a center of the shield cap 40. For example, as illustrated in FIG. 3, a first center O1 of the shield cap 40 is offset, e.g., misaligned, with respect to a second center O2 of the connection protrusion 40a.

The connection protrusion 40a may be implemented variously, such as a predetermined protrusion corresponding to the connection groove 41a of the cap hook 41. As such, as illustrated in FIG. 4, the asymmetry causes a first edge of the connection protrusion 40a to be inserted into the connection groove 41a upon engagement, while a second edge of the connection protrusion 40a is positioned on the rough surface of the shield mask 20 and is spaced apart from the connection groove 41a.

A degree at which the second center O2 of the connection protrusion 40a is deviated from the first center O1 of the shield cap 40 may be determined in accordance with the connection margin of the shield cap 40 relatively to the fixing hole 21. That is, the deviation between the two centers is adjusted such that the shield cap 40 uniformly covers a circumferential gap of the fixing hole 21 upon engagement between the connection groove 41a and the cap hook 41.

Figure 5:
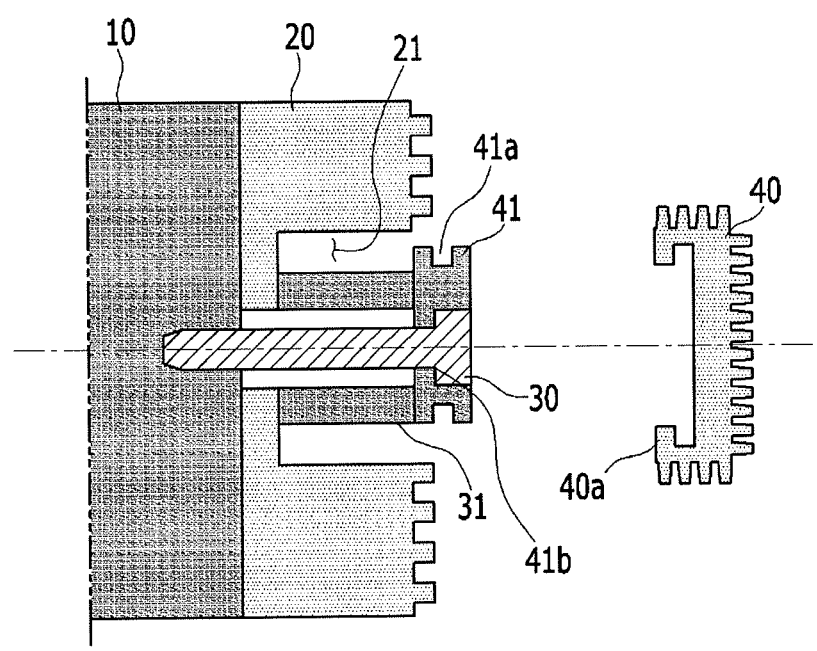
FIG. 5 illustrates an enlarged exploded sectional view of a shield mask mounting fitting for thin film deposition according to a second exemplary embodiment.
Figure 6:
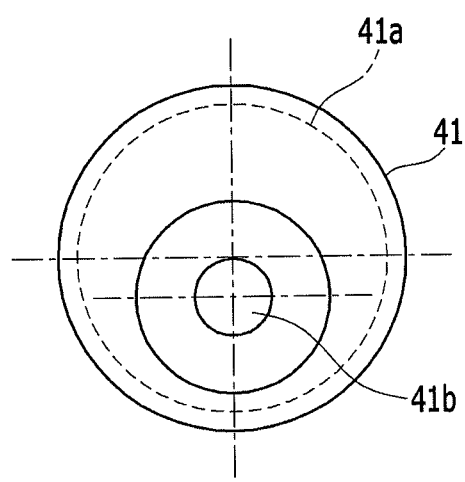
FIG. 6 illustrates a top plan view of a cap hook of the shield mask mounting fitting for thin film deposition according to the second exemplary embodiment.
Figure 7:
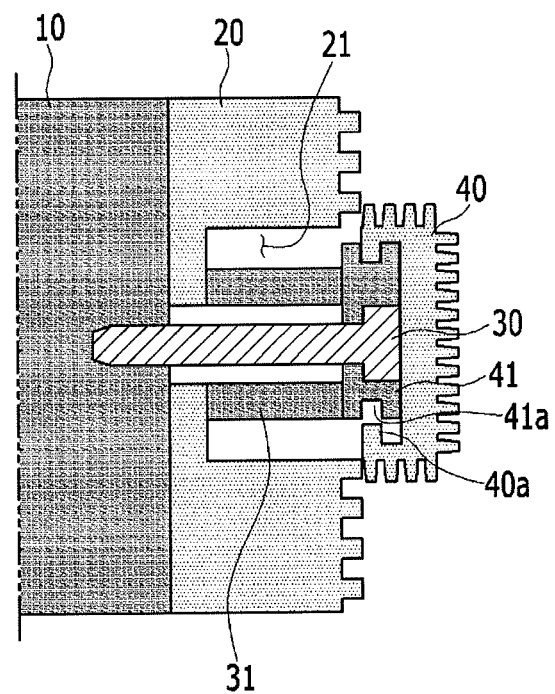
FIG. 7 illustrates an assembled cross-sectional view of the shield mask mounting fitting in FIG. 5.

In accordance with another embodiment, as illustrated in FIGS. 5 to 7, the cap hook 41 may be formed to have an asymmetrical structure with respect to an axis through the fixing bolt 30. As such, a center of an insertion hole 41b into which the fixing bolt 30 is inserted is disposed at a position deviated from a center of the cap hook 41, as illustrated in FIG. 6.

The connection groove 41a of the cap hook 41 may be implemented variously, e.g., as a predetermined groove shape corresponding to the connection protrusion 40a of the shield cap 40. A degree at which the center of the insertion hole 41b is deviated from the center of the cap hook 41 may be determined such that the connection margin of the shield cap 40 corresponding to the fixing hole 21 uniformly covers a circumferential gap of the fixing hole 21 upon engagement between the shield cap 40 and the cap hook 41, as illustrated in FIG. 7, thereby efficiently blocking inflow of a deposition particle into the fixing hole 21.

The shield cap 40 and he cap hook 41 may be implemented in various forms according to a shape of the fixing hole 21 of the shield mask 20. Preferably, as shown in FIG. 3 or 6, the shield mask mounting fitting is formed to have a circular shape in top view, which provides convenience in processing of the connection protrusion 40a and the connection groove 41a.

By way of summation and review, in an existing sputtering apparatus, since electrons of the target material diffuse omnidirectionally during sputtering, plasma of the target may be deposited on a region other than a deposition region of the substrate intended for metal deposition. Also, atoms may leak through a gap between a ground shield and a mask, and may be deposited on a wall of a chamber to form impurity. The impurity generated as described above may cause arc discharge, resulting in discharge instability.

While an extending portion that increases an area corresponding to the mask or reduces a gap with the mask has been attempted, such an extending portion increases material costs due to an excessive size thereof. Further, installation of such an extending portion may be complicated due to interference of neighboring parts, and maintenance of stable posture thereof may not be ensured during the sputtering process.

In contrast, according to a shield mask mounting fitting for thin film deposition according to an exemplary embodiment, it is possible to apply an asymmetric structure offset from a center of a fixing hole of a shield mask, thereby covering a circumferential gap of the fixing hole of the shield mask with a stable protection margin without a change in size. As such, peeling of a deposition film and shortening of the preventive maintenance (PM) cycle may be prevented. Further, productivity in fabrication may be improved, while material costs may decrease, because structures of the shield cap and the cap hook are simple.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A shield mask mounting fitting, comprising:
a shield mask to be mounted on a chamber wall of a sputtering apparatus, the shield mask including a fixing hole;
a fixing bolt connecting the shield mask to the chamber wall through the fixing hole;
a cap hook surrounding a top of the fixing bolt;
a bushing extending between a surface of the shield mask and the cap hook, the fixing bolt being concentric with the bushing and the fixing hole; and
a shield cap engaged with the cap hook and covering the top of the fixing bolt, the shield cap extending beyond the cap hook to omnidirectionally cover a periphery of the fixing hole,
wherein one of the cap hook and the shield cap has an asymmetric structure with respect to an axis extending through a center of the fixing bolt, and
wherein the bushing extends through the fixing hole, such that an empty space is defined between sidewalls of the bushing and the shield mask.

2. The shield mask mounting fitting as claimed in claim 1, wherein the cap hook includes a connection groove engaged with a connection protrusion of the shield cap, a center of the shield cap being offset with respect to a center of the connection protrusion in top view.

3. The shield mask mounting fitting as claimed in claim 1, wherein the cap hook includes an insertion hole, the fixing bolt being inserted through the insertion hole, and a center of the cap hook being offset with respect to a center of the insertion hole in top view.

4. The shield mask mounting fitting as claimed in claim 1, wherein surfaces of the shield mask and the shield cap facing away from the chamber wall are rough surfaces.

5. The shield mask mounting fitting as claimed in claim 1, wherein the shield cap directly contacts a top surface of the shield mask to completely cover the fixing hole.

6. The shield mask mounting fitting as claimed in claim 1, wherein the cap hook includes a connection groove that completely surrounds the fixing bolt, a portion of the shield cap being insertable only into a part of the connection groove.

7. The shield mask mounting fitting as claimed in claim 1, wherein the shield cap directly contacts a single side of the cap hook, as viewed in a cross-section view.

8. The shield mask mounting fitting as claimed in claim 7, wherein the shield cap is directly engaged with a first side of the cap hook, a second side of the cap hook, opposite the first side as viewed in the cross-sectional view, being completely spaced apart from the shield cap.

9. The shield mask mounting fitting as claimed in claim 1, wherein top surfaces of the fixing bolt and the cap hook are substantially aligned, the top surfaces of the fixing bolt and cap hook being disposed away from a top surface of the shield mask, and the shield cap being in direct contact with the top surfaces of the fixing bolt, cap hook, and shield mask.

* * * * *